United States Patent
Kobayashi et al.

(10) Patent No.: US 9,006,894 B2
(45) Date of Patent: Apr. 14, 2015

(54) WIRING BOARD AND LIGHT EMITTING DEVICE

(71) Applicant: Shinko Electric Industries Co., Ltd., Nagano-shi, Nagano (JP)

(72) Inventors: Kazutaka Kobayashi, Nagano (JP); Yasuyoshi Horikawa, Nagano (JP); Mitsuhiro Aizawa, Nagano (JP); Koji Hara, Nagano (JP)

(73) Assignee: Shinko Electric Industries Co., Ltd., Nagano-Shi (JP)

( * ) Notice: Subject to any disclaimer, the term of this patent is extended or adjusted under 35 U.S.C. 154(b) by 0 days.

(21) Appl. No.: 14/206,131

(22) Filed: Mar. 12, 2014

(65) Prior Publication Data
US 2014/0264417 A1    Sep. 18, 2014

(30) Foreign Application Priority Data
Mar. 14, 2013    (JP) .................................. 2013-052293

(51) Int. Cl.
| | |
|---|---|
| H01L 23/48 | (2006.01) |
| H01L 33/60 | (2010.01) |
| H01L 33/62 | (2010.01) |
| H05K 1/02 | (2006.01) |
| H01L 25/075 | (2006.01) |

(52) U.S. Cl.
CPC ............... *H01L 33/60* (2013.01); *H01L 33/62* (2013.01); *H05K 1/0201* (2013.01); *H01L 2224/48091* (2013.01); *H01L 2224/48137* (2013.01); *H01L 2224/73265* (2013.01); *H01L 2924/0002* (2013.01); *H01L 25/0753* (2013.01); *H01L 2224/45144* (2013.01)

(58) Field of Classification Search
CPC ..... H01L 33/60; H01L 33/62; H01L 25/0753; H05K 1/02
See application file for complete search history.

(56) References Cited

U.S. PATENT DOCUMENTS

| | | | |
|---|---|---|---|
| 8,704,433 B2 * | 4/2014 | Jung et al. ........................ | 313/46 |
| 2007/0018175 A1 * | 1/2007 | Mazzochette et al. ........... | 257/81 |
| 2007/0057364 A1 * | 3/2007 | Wang et al. ..................... | 257/701 |
| 2009/0315057 A1 * | 12/2009 | Konishi et al. .................. | 257/98 |
| 2010/0044640 A1 * | 2/2010 | Agrawal et al. ........... | 252/301.36 |
| 2010/0291374 A1 * | 11/2010 | Akarsu et al. .................. | 428/328 |
| 2011/0133218 A1 * | 6/2011 | Lee .................................. | 257/88 |
| 2014/0042900 A1 * | 2/2014 | Hotta et al. .................... | 313/512 |

FOREIGN PATENT DOCUMENTS

JP    2011-044593    3/2011

* cited by examiner

*Primary Examiner* — William D Coleman
(74) *Attorney, Agent, or Firm* — Rankin, Hill & Clark LLP

(57) ABSTRACT

There is provided a wiring board for mounting a light emitting element thereon. The wiring board includes: an insulating layer; a wiring pattern on the insulating layer; a reflecting layer on the insulating layer to cover the wiring pattern, wherein the light emitting element is to be mounted on a surface of the reflecting layer; and a silica film on the surface of the reflecting layer.

8 Claims, 10 Drawing Sheets

WIRING BOARD AND LIGHT EMITTING DEVICE

This application claims priority from Japanese Patent Application No. 2013-052293, filed on Mar. 14, 2013, the entire contents of which are herein incorporated by reference.

BACKGROUND OF THE INVENTION

1. Technical Field

The present disclosure relates to a wiring board and a light emitting device.

2. Description of the Related Art

Recently, light emitting diodes (LEDs) having low power consumption and long lives have drawn attention as light sources. For example, a lighting module mounted with a plurality of light emitting elements such as LEDs has been proposed (for example, see JP-A-2011-44593). In such a lighting module, a reflecting layer (an insulating layer) for reflecting light emitted from the mounted light emitting elements is formed in an outermost layer and the light emitting elements are mounted on the reflecting layer by an adhesive agent such as a die bonding material.

However, from diligent studies of the present inventors, it has been obvious that adhesive strength between the adhesive agent (die bonding material) for fixing the light emitting elements and the reflecting layer is low in the lighting module. Accordingly, when the adhesive agent is used to bond the light emitting elements to such a reflecting layer, there is a problem in that the light emitting elements are apt to be separated from the reflecting layer.

SUMMARY OF THE INVENTION

According to one or more aspects of the present invention, there is provided a wiring board for mounting a light emitting element thereon. The wiring board includes: an insulating layer; a wiring pattern on the insulating layer; a reflecting layer on the insulating layer to cover the wiring pattern, wherein the light emitting element is to be mounted on a surface of the reflecting layer; and a silica film on the surface of the reflecting layer.

According to one of aspects of the present embodiment, it is possible to obtain an effect that adhesive strength between a reflecting layer and an adhesive agent can be improved when the adhesive agent is used to bond a light emitting element to the reflecting layer.

DETAILED DESCRIPTION

Embodiments will be described below respectively with reference to the accompanying drawings. Incidentally, a characteristic part is enlarged and shown in some accompanying drawings for convenience's sake in order to make it easy to understand that characteristic, and the dimensional ratios etc. of respective constituent elements do not always agree with real ones. In addition, hatching of a part of members is omitted in each sectional view in order to make it easy to understand the sectional structure of each member.

First Embodiment

A first embodiment will be described below in accordance with FIGS. 1 to 4, FIGS. 5A to 5D and FIGS. 6A to 6C.

First, the structure of a wiring board 10 will be described in accordance with FIGS. 1 to 3.

Figure 1:
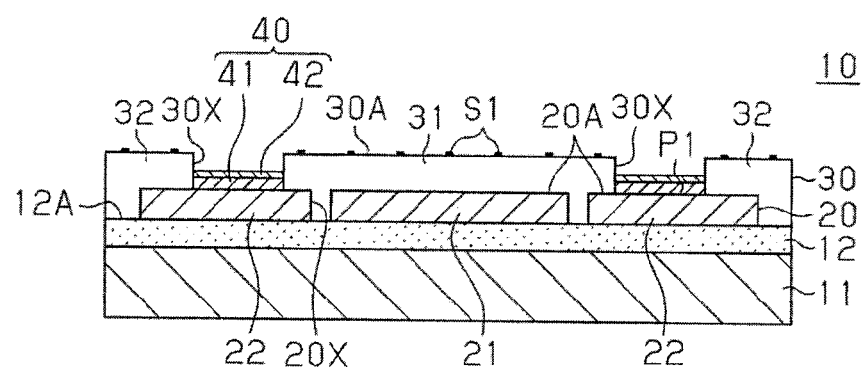
FIG. 1 is a schematic sectional view showing a wiring board according to a first embodiment, which is a sectional view taken along the line 1-1 in FIG. 2 and FIG. 3.

As shown in FIG. 1, the wiring board 10 has a heat sink 11, an insulating layer 12 formed on the heat sink 11, wiring patterns 20 formed on the insulating layer 12, an insulating layer 30 covering a part of the wiring patterns 20, and metal layers 40 formed on the wiring patterns 20.

For example, the heat sink 11 is a flat plate substantially shaped like a rectangle in plan view. For example, copper (Cu), a Cu based alloy, iron-nickel (Fe—Ni), an Fe—Ni based alloy, aluminum (Al) or an Al based alloy etc. may be used as the material of the heat sink 11. The thickness of the heat sink 11 may be set to be, for example, about 200 to 2,000 µm.

The insulating layer 12 is formed to cover the whole of an upper surface of the heat sink 11. In other words, the heat sink 11 is formed on a lower surface (second surface) of the insulating layer 12. The insulating layer 12 has a function of insulating the wiring patterns 20 and the heat sink 11 from each other and a function of bonding the wiring patterns 20 and the heat sink 11 to each other. For example, the insulating layer 12 is a flat plate substantially shaped like a rectangle in plan view. For example, an insulating resin such as a polyimide based resin or an epoxy based resin, or a resin material in which an epoxy based resin is mixed with a filler such as silica ($SiO_2$) or alumina may be used as the material of the insulating layer 12. The thickness of the insulating layer 12 may be set to be, for example, about 25 to 200 µm.

The plurality of wiring patterns 20 are formed on an upper surface 12A (first surface) of the insulating layer 12. The thickness of each wiring pattern 20 may be set to be, for example, about 3 to 105 µm. For example, copper or a copper alloy may be used as the material of the wiring patterns 20.

Figure 3:
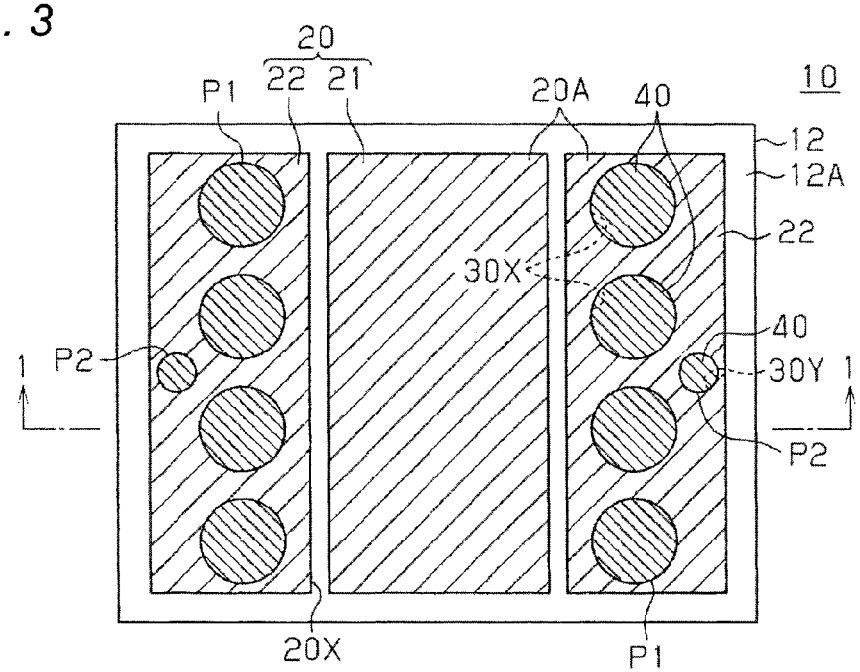
FIG. 3 is a schematic plan view showing the wiring board according to the first embodiment, wherein illustration of a part of members (an insulating layer formed in an outermost surface) is omitted in this drawing.

As shown in FIG. 3, for example, each of the wiring patterns 20 is substantially formed into a rectangular shape in plan view. The plurality of wiring patterns 20 are disposed in parallel with and adjacently to one another in a center portion of the wiring board 10. In addition, each groove-like opening portion 20X from which the insulating layer 12 as a layer under the wiring patterns 20 is exposed is formed between adjacent ones of the wiring patterns 20. The plurality of wiring patterns 20 are separated from one another by the opening portions 20X so that the plurality of wiring patterns 20 can be electrically independent of one another. Here, the length of the long side of each wiring pattern 20 may be, for example, about 5 to 10 mm and the length of the short side of the wiring pattern 20 may be, for example, about 1 to 5 mm. In addition, the width between adjacent ones of the wiring patterns 20 (the width of each opening portion 20X) may be, for example, about 0.1 to 0.3 mm.

The wiring patterns 20 have a wiring pattern 21 formed in a light emitting element mounting region in which light emitting elements 51 (see FIG. 4) are mounted, and wiring patterns 22 formed so that the wiring pattern 21 can be put between the wiring patterns 22 in plan view. The wiring pattern 21 may be connected to a ground line.

As shown in FIG. 1, the insulating layer 30 is formed on the upper surface 12A of the insulating layer 12 to thereby cover a part of the wiring patterns 20. The insulating layer 30 is formed to cover the whole of a front surface (upper surface and side surface) of the wiring pattern 21 formed in the light emitting element mounting region. Incidentally, the thickness between the upper surface 12A of the insulating layer 12 and an upper surface 30A of the insulating layer 30 may be set to be, for example, about 50 to 150 µm.

Figure 2:
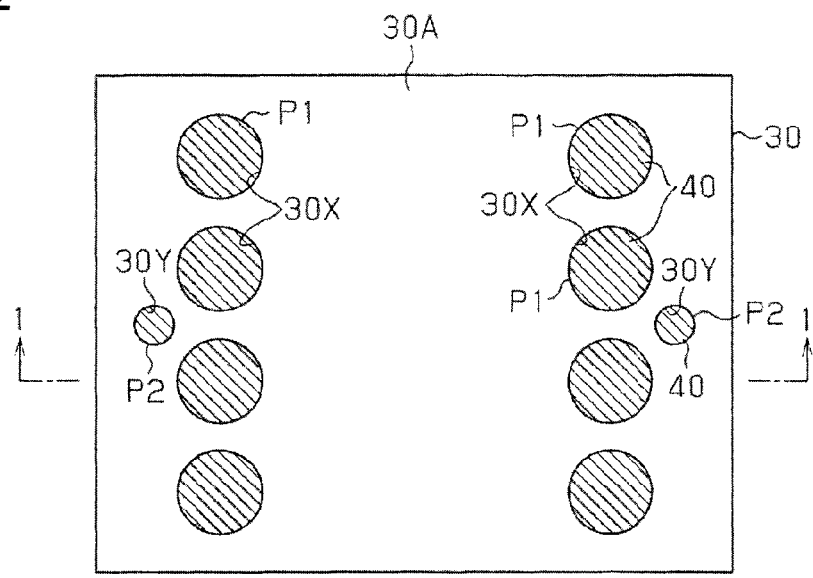
FIG. 2 is a schematic plan view showing the wiring board according to the first embodiment.

As shown in FIG. 2, a plurality of opening portions 30X for exposing parts of the wring patterns 22 as wire bonding pads P1 are formed in the insulating layer 30, and a pair of opening portions 30Y for exposing parts of the wiring patterns 22 as electrode terminals P2 are formed in the insulating layer 30. Electric power is fed to the electrode terminals P2 from an external power supply through wires of a mount substrate.

The planar shape of each of the opening portions 30X and 30Y is substantially formed, for example, into a circular shape. The plurality of opening portions 30X (four opening portions 30X in this case) are arrayed on each of the wiring patterns 22 along the longitudinal direction of the wiring pattern 22. The opening portions 30Y are formed on the wiring patterns 22 so as to be located outside the opening portions 30X respectively.

As shown in FIG. 3, the metal layers 40 are formed on the wiring patterns 20 exposed from the opening portions 30X and 30Y, that is, on the pads P1 and the electrode terminals P2. Each of the metal layers 40 is substantially formed, for example, into a circular shape in plan view, in the same manner as the opening portion 30X or 30Y. In an exemplary metal layer as the metal layer 40, a nickel (Ni) layer and a gold (Au) layer may be laminated on an upper surface 20A of the wiring pattern 20 sequentially in this order. Other examples of the metal layer 40 may include a metal layer in which an Ni layer, a palladium (Pd) layer and an Au layer are laminated on the upper surface 20A of the wiring pattern 20 sequentially in this order, a metal layer in which an Ni layer, a Pd layer and a silver (Ag) layer are laminated sequentially likewise, and a metal layer in which an Ni layer, a Pd layer, an Ag layer and an Au layer are laminated sequentially likewise. A metal layer (electroless plating metal layer) formed, for example, by an electroless plating technique may be used as each of the Ni layer, the Au layer, the Pd layer and the Ag layer. In addition, the Ni layer is a metal layer made of Ni or an Ni alloy. The Au layer is a metal layer made of Au or an Au alloy. The Pd layer is a metal layer made of Pd or a Pd alloy. The Ag layer is a metal layer made of Ag or an Ag alloy. In the embodiment, an Ni layer 41 and an Au layer 42 are laminated in this order to thereby form the metal layer 40 on the upper surface 20A of the wiring pattern 20 exposed from the opening portion 30X or 30Y, as shown in FIG. 1. The thickness of the Ni layer 41 may be set to be, for example, about 0.1 to 3 µm. The thickness of the Au layer 42 may be set to be, for example, about 0.01 to 1 µm. Incidentally, when the pads P1 are covered with the metal layers 40, the metal layers 40 serve as pads. When the electrode terminals P2 are covered with the metal layers 40, the metal layers 40 serve as electrode terminals.

A material excellent in heat resistance may be used as the material of the insulating layer 30. For example, a resin material containing silicone may be used as the material of the insulating layer 30. Such a silicone based material has excellent characteristics, i.e. high heat resistance and high light resistance. Therefore, the silicone based material is suitable for the material of an insulating layer, such as the insulating layer 30, formed in an outermost surface of the wiring board 10.

In addition, preferably, the insulating layer 30 has a high reflectance. For example, the insulating layer 30 has a reflectance not smaller than 50% (preferably not smaller than 80%) at wavelengths in the range of from 450 nm to 700 nm. Such an insulating layer 30 is also referred to as a white resist layer or a reflecting layer. For example, a white insulating resin may be used as the material of this insulating layer 30. For example, a resin material containing a white filler or pigment made of titanium oxide ($TiO_2$), barium sulfate ($BaSO_4$), silica ($SiO_2$), alumina, etc. in a silicone based resin or an epoxy based resin may be used as the white insulating resin. When the outermost surface of the wiring board 10 is covered with such an insulating layer 30 (white resist layer), the reflectance of light from each light emitting element 51 (see FIG. 4) mounted on the wiring board 10 can be increased so that the loss of light quantity in the light emitting element 51 can be reduced.

Further, it is preferable that, for example, an insulating resin whose thermal conductivity is high (for example, about 0.5 to 10 W/mK) is used as the material of the insulating layer 30. Incidentally, as the material of the insulating layer 30, a photosensitive resin may be used or a non-photosensitive resin (for example, a thermosetting resin) having no photosensitivity may be used. Incidentally, the insulating layer 30 made of the resin material containing silicone is used in this embodiment.

Silica ($SiO_2$) is partially contained in the upper surface 30A of the insulating layer 30. That is, a silica film S1 is formed in parts of the upper surface 30A of the insulating layer 30. For example, a larger amount of silica ($SiO_2$) than that of silicone (Si—O) is contained in the upper surface 30A of the insulating layer 30. For example, when narrowband spectrum measurement is applied to the upper surface 30A of the insulating layer 30 by an ESCA (Electron Spectroscopy for Chemical Analysis) apparatus, no peak can be detected near 102.1 eV corresponding to silicone (Si—O) but a peak can be detected near 103.5 eV corresponding to silica ($SiO_2$). As analysis conditions of the ESCA, for example, Quantera SXM made by ULVAC-PHI, INCORPORATED is used as an apparatus and AlKα (monochromator) is used as an X-ray source. In addition, the following conditions are also used as the ESCA analysis conditions. That is, the extraction angle of photoelectrons is set at 45°, the measurement region is set as a region having a diameter of about 100 µm and a charge neutralization mechanism is used.

In addition, a light emitting element mounting region is provided in the upper surface of the insulating layer 30. In detail, the insulating layer 30 has an insulating layer 31 and an insulating layer 32. The insulating layer 31 covers the whole of a front surface (upper surface and side surface) of the wiring pattern 21 and covers the upper surface of the insulating layer 12 and upper surfaces of the wiring patterns 22 surrounding the wiring pattern 21. The insulating layer 32 covers the whole of the upper surface 12A of the insulating layer 12 and parts of the upper surfaces 20A of the wiring patterns 22, which are exposed from the insulating layer 31. The light emitting element mounting region is provided in the upper surface of the insulating layer 31.

Here, the material of the insulating layer 31 and the material of the insulating layer 32 may be the same material or may be different materials. When the material of the insulating layer 31 and the material of the insulating layer 32 are set to be different materials, it is preferable that, for example, at least the insulating layer 31 of the insulating layers 31 and 32 is made of a material having a high reflectance. In addition, the silica film Si is formed on at least the insulating layer 31 of the insulating layers 31 and 32, specifically on the insulating layer 31 where the light emitting element mounting region is provided. In the embodiment, the insulating layer 31 and the insulating layer 32 are made of the same material and formed integrally with each other.

Figure 4:
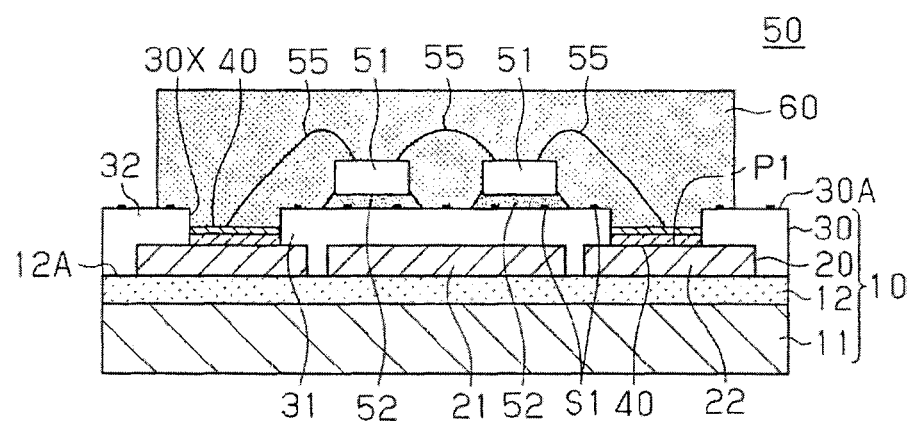
FIG. 4 is a schematic sectional view showing a light emitting device according to the first embodiment.

Next, the structure of a light emitting device 50 will be described in accordance with FIG. 4. The light emitting device 50 has the wiring board 10, a plurality of light emitting elements 51 mounted on the wiring board 10, bonding wires 55, and a sealing resin 60 which seals the light emitting elements 51 and the bonding wires 55, etc.

The light emitting elements 51 are mounted on the insulating layer 31 of the wiring board 10. Specifically, the light emitting elements 51 are bonded to the light emitting element mounting region of the insulating layer 31 through an adhesive agent 52 in the state in which the light emitting surfaces of the light emitting elements 51 face up. Electrodes on one side (not shown), specifically, outer electrodes of the light emitting elements 51 are electrically connected to the metal layers 40 formed in the opening portions 30X of the insulating layer 30 through the bonding wires 55. In addition, electrodes (not shown) of adjacent ones of the light emitting elements 51 are electrically connected to each other through the bonding wires 55. Connection of the light emitting elements 51 mounted on such an insulating layer 31 may be series connection or parallel connection, or may be both series connection and parallel connection.

Incidentally, although not shown, the metal layers 40 exposed from the opening portions 30Y (see FIG. 2) of the insulating layer 30, that is, the electrode terminals P2 are electrically connected to a mount substrate (not shown). By the connection made thus, the light emitting elements 51 are supplied with electric power from an external power supply (not shown) through the mount substrate, the electrode terminals P2, the wiring patterns 20, etc. to emit light.

For example, a light emitting diode (LED) or a vertical cavity surface emitting laser (VCSEL) may be used as each of the light emitting elements 51. For example, an Au wire, an aluminum (Al) wire, a Cu wire, etc. may be used as each of the bonding wires 55.

For example, a die bonding material (die attach material), a silver paste, etc. may be used as the adhesive agent 52. A die bonding material made of a silicone based resin, a die bonding material made of an epoxy based resin, or a die bonding material containing a metal filler such as a silver filler or a filler such as an alumina filler in a silicone based resin or an epoxy based resin may be used as the die bonding material. In the embodiment, a die bonding material containing a silicone based resin and a silver filler is used as the adhesive agent 52.

The sealing resin 60 is provided on the upper surface of the wiring board 10 so as to seal the light emitting elements 51 and the bonding wires 55 etc. For example, a resin material containing a fluorescent substance in a silicone-based resin may be used as the material of the sealing resin 60. When such a resin material containing a fluorescent substance is formed on the light emitting elements 51, a mixed color of light emitted from the light emitting elements 51 and light emitted from the fluorescent substance can be used to control the emission color of the light emitting device 50 variously. Also, the sealing resin 60 may be provided on the upper surface of the wiring board 10 by injecting a resin material into a frame-shaped dam member (not shown) disposed on the upper surface of the insulating layer 30 at a peripheral portion thereof. The dam member may be made of metal and may serve as a reflection member.

Next, a method for manufacturing the light emitting device 50 will be described. One wiring board 10 and one light emitting device 50 will be enlarged and explained in the following description. In practice, however, a member which will be a plurality of wiring boards 10 is manufactured collectively on one substrate and then divided into individual wiring boards 10 or a member which will be a plurality of light emitting devices 50 is manufactured collectively on one substrate and then divided into individual light emitting devices 50.

Figure 5A:
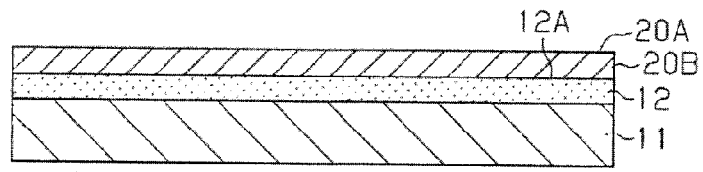
FIG. 5A to 5D are schematic sectional views showing a method for manufacturing the light emitting device according to the first embodiment.

As shown in FIG. 5A, first, an insulating layer 12 is formed to cover the whole of an upper surface of a heat sink 11 and a copper foil 20B is formed to cover the whole of an upper surface 12A of the insulating layer 12. For example, a single-sided copper clad substrate in which a copper foil 20B is deposited on one surface of the insulating layer 12 is bonded to the heat sink 11 so that the insulating layer 12 and the copper foil 20B can be formed on the heat sink 11. Alternatively, for example, an insulating resin film with a copper foil is formed on the heat sink 11 so that the insulating layer 12 and the copper foil 20B can be formed on the heat sink 11. On this occasion, a large-sized substrate from which a large number of wiring boards 10 can be produced is used as the heat sink 11.

Figure 5B:
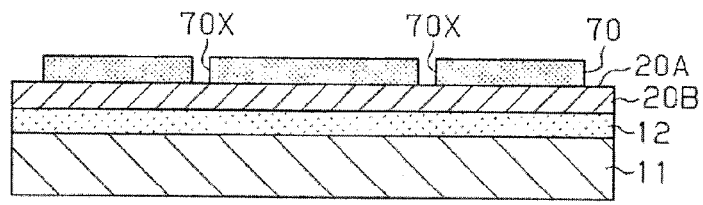

Next, a resist layer 70 having opening portions 70X in predetermined places are formed on an upper surface 20A of the copper foil 20B as shown in FIG. 5B. This resist layer 70 is formed to cover the copper foil 20B corresponding to required wiring patterns 20 (see FIG. 1). In other words, the resist layer 70 has the opening portions 70X formed in positions corresponding to opening portions 20X. A material having etching resistance may be used as the material of the resist layer 70. Specifically, a photosensitive dry film resist or a liquid photoresist (for example, a dry film resist or a liquid resist made of a novolac based resin, an acrylic-based resin, etc.) or the like may be used as the material of the resist layer 70. When, for example, the photosensitive dry film resist is used, the dry film is formed on the upper surface 20A of the copper foil 20B by thermocompression bonding and patterned by photolithography. Thus, the resist layer 70 having the opening portions 70X is formed. Incidentally, when the liquid photoresist is used, the resist layer 70 can be formed through similar steps.

Figure 5C:
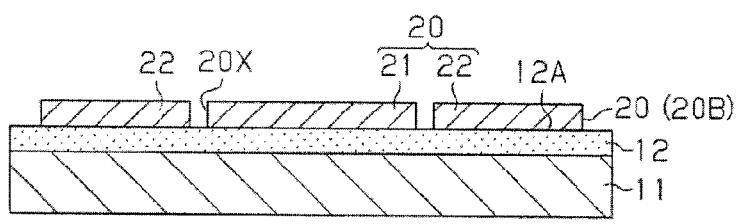

Successively, the copper foil 20B is etched with the resist layer 70 as an etching mask so that the copper foil 20B can be patterned into a predetermined shape. In this manner, as shown in FIG. 5C, the opening portions 20X are formed in the copper foil 20B so that the required wiring patterns 20 are formed on the upper surface 12A of the insulating layer 12.

That is, in this step, the wiring pattern 21 and the wiring patterns 22 are formed on the upper surface 12A of the insulating layer 12. Then, the resist layer 70 shown in FIG. 5B is removed, for example, by an alkaline strip liquid.

Figure 5D:
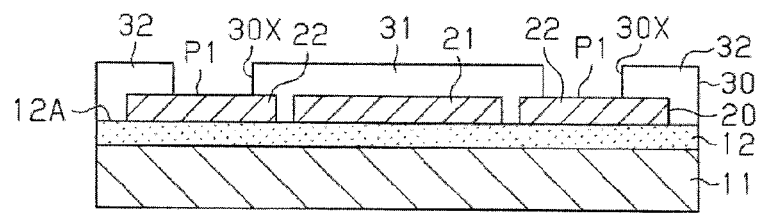

Next, an insulating layer 30 having opening portions 30X and 30Y (electrode terminals P2 and the opening portions 30Y are not shown in FIG. 5D) corresponding to pads P1 and the electrode terminals P2 respectively is formed on the insulating layer 12 and the wiring patterns 20 in a step shown in FIG. 5D. Specifically, the insulating layer 30 which covers the whole of a front surface of the wiring pattern 21 and which exposes parts of upper surfaces of the wiring patterns 22 as the pads P1 or the electrode terminals P2 is formed on the insulating layer 12. The insulating layer 30 may be formed, for example, by a method of screen-printing a resin paste. Alternatively, the insulating layer 30 may be formed by applying a liquid resin by means of an injector (a dispenser). When a photosensitive insulating resin is used as the material of the insulating layer 30, the insulating layer 30 may be formed by photolithography.

Successively, the insulating layer 30 is cured (subjected to thermosetting treatment) in an atmosphere at a temperature of about 150° C. so as to be hardened.

Figure 6A:
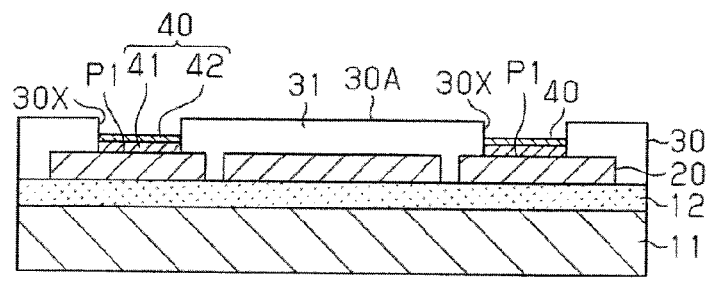
FIG. 6A to 6C are schematic sectional views showing the method for manufacturing the light emitting device according to the first embodiment.

Next, metal layers 40 are formed on the wiring patterns 20 (wiring patterns 22) exposed from the insulating layer 30, for example, by an electroless plating technique, in a step shown in FIG. 6A. Here, when each of the metal layers 40 has a structure in which an Ni layer 41 and an Au layer 42 are laminated sequentially, the Ni layer 41 and the Au layer 42 are laminated sequentially on the wiring pattern 22 exposed from the insulating layer 30, for example, by the electroless plating technique.

When the insulating layer 30 is made of a resin material containing silicone on this occasion as in the embodiment, a silicone (Si—O) film is formed on an outermost surface (upper surface 30A) of the insulating layer 30. However, it has been understood from diligent studies of the present inventors that adhesive strength between the insulating layer and an adhesive agent is low when light emitting elements are mounted on the insulating layer 30 (insulating layer 31) through the adhesive agent in the state in which the silicone film is formed thus in the outermost surface.

As a result of the diligent studies as to the aforementioned problem, the present inventors have found out that the adhesive strength between the insulating layer 30 and the adhesive agent for fixing the light emitting elements can be improved when a silica ($SiO_2$) film is formed in parts of the outermost surface of the insulating layer 30.

Figure 6B:
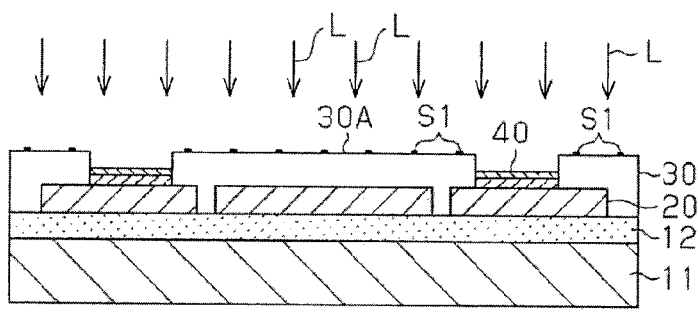

To this end, surface treatment for forming a silica film S1 on the upper surface 30A of the insulating layer 30 is subjected to the structure shown in FIG. 6A in a step shown in FIG. 6B. Such surface treatment is performed, for example, to make reactive oxygen species react with the upper surface 30A of the insulating layer 30. In this manner, the silicone film formed on the insulating layer 30 is modified so that the silica film S1 can be formed on the insulating layer 30.

For example, in the example shown in FIG. 6B, ultraviolet treatment is applied to the structure shown in FIG. 6A to thereby change (alter) the silicone film into the silica film S1. Thus, the silica film S1 is formed. That is, the upper surface of the structure shown in FIG. 6A (at least the upper surface 30A of the insulating layer 31) is irradiated with ultraviolet light L. Oxygen is excited by the ultraviolet light L to thereby generate reactive oxygen species whose amount depends on oxygen concentration in a treatment chamber where a workpiece (the structure shown in FIG. 6A in this case) is placed, ultraviolet wavelength and illuminance. The reactive oxygen species reacts with the silicone film formed on the upper surface 30A of the insulating layer 30 so that the $SiO_2$ film is formed. Thus, the silica film S1 is formed on the upper surface 30A of the insulating layer 30. Ultraviolet light (excimer UV light) at a wavelength of 172 nm which is largely absorbed by oxygen may be used preferably as the ultraviolet light L here. When the excimer UV light is used as the ultraviolet light L, the oxygen concentration may be set to be, for example, in a range of about 0.01 to 5%. In addition, the radiation dose of the excimer UV light (=illuminance×radiation time) may be set to be, for example, in a range of about 500 to 4,000 mJ/cm². Incidentally, the radiation dose depends on the oxygen concentration and a distance between an illumination lamp (for example, a dielectric barrier discharge excimer lamp) radiating the excimer UV light and the front surface of the workpiece.

Alternatively, oxygen plasma treatment may be applied to the structure shown in FIG. 6A to modify the silicone film into the silica ($SiO_2$) film Si so that the silica film S1 can be formed on the upper surface 30A of the insulating layer 30. That is, surface treatment may be applied to the insulating layer 30 using reactive oxygen species generated by oxygen gas plasma (plasma using oxygen as the source). Specifically, when oxygen gas is introduced into a high frequency electric field in the oxygen plasma treatment, the oxygen gas is transformed into plasma and dissociated so that reactive oxygen species is generated. The reactive oxygen species reacts with the silicone film formed on the upper surface 30A of the insulating layer 30 so that the silica ($SiO_2$) film S1 is formed on the upper surface 30A of the insulating layer 30. The oxygen plasma treatment may be performed under the following conditions. For example, the RF output is set at 250 W, the flow rate of oxygen is set at 15 sccm, the degree of vacuum is set at 20 Pa, and the treatment time is set at about 30 seconds.

In addition, plasma treatment using gas containing oxygen and carbon tetrafluoride ($CF_4$) as the source may be applied to the structure shown in FIG. 6A so that the silica film S1 can be formed on the upper surface 30A of the insulating layer 30. However, for such plasma treatment, it is necessary to provide a system for removing hydrofluoric acid from exhaust gas, a combustion system for reducing $CF_4$ gas released to the atmosphere, or the like.

In addition, ozonization treatment or corona discharge treatment may be applied to the structure shown in FIG. 6A so that the silica film S1 can be formed on the upper surface 30A of the insulating layer 30. Alternatively, the structure shown in FIG. 6A may be irradiated with active energy rays using a high pressure mercury lamp etc. as a light source so that the silica film S1 can be formed on the upper surface 30A of the insulating layer 30.

When the aforementioned surface treatment is applied to the upper surface 30A of the insulating layer 30, the silica film S1 can be formed on the upper surface 30A of the insulating layer 30. Further, a hydroxyl group is generated in an outermost surface of the silica film Si due to the surface treatment.

The wiring board 10 shown in FIGS. 1 to 3 can be manufactured by the aforementioned manufacturing steps.

Figure 6C:
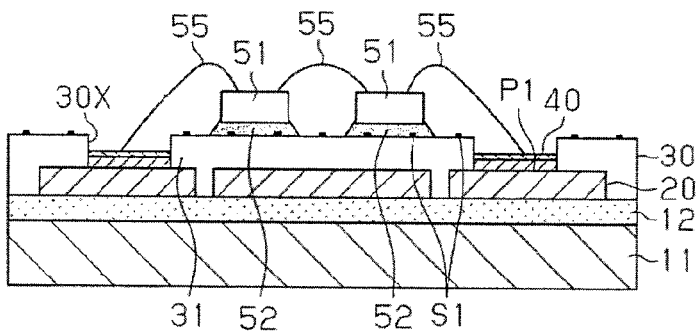

Next, a plurality of light emitting elements 51 are bonded (fixed) to the upper surface 30A of the insulating layer 30 (insulating layer 31) of the wiring board 10 by an adhesive agent 52 in a step shown in FIG. 6C (die bonding). On this occasion, the light emitting elements 51 are mounted on the insulating layer 31 while light emitting surfaces of the light emitting elements 51 where electrode terminals (not shown) are formed face up.

In this step, the silica film Si is formed on the upper surface 30A of the insulating layer 30 and the hydroxyl group is generated in the outermost surface of the silica film S1 when the light emitting elements 51 are bonded on the insulating layer 30 by the adhesive agent 52. In this manner, adhesive strength between the insulating layer 30 and the adhesive agent 52 can be improved.

In detail, it is inferred that since the silica film S1 having the hydroxyl group generated in its outermost surface is formed on the upper surface 30A of the insulating layer 30, the hydroxyl group of the silica film S1 is hydrolyzed with a hydroxyl group or a carboxylic acid group of the adhesive agent 52 (die bonding material) to thereby form a covalent bond and exhibit high adhesion. Particularly, when the adhesive agent 52 is a die bonding material made of a silicone based resin, it is inferred that an Si—O—Si bond (siloxane bond) is generated easily to thereby improve the adhesive strength between the insulating layer 30 and the adhesive agent 52.

In addition, the silica film Si which is formed on the upper surface 30A of the insulating layer 30 after surface treatment is applied to the upper surface 30A of the insulating layer 30 by ultraviolet treatment etc. is higher in hardness than the silicone film which is formed on the upper surface 30A of the insulating layer 30 before the surface treatment is applied to the upper surface 30A of the insulating layer 30. Therefore, when the silica film S1 is present on the upper surface 30A of the insulating layer 30, hardness of the bonding surface (that is, the upper surface 30A) where the light emitting elements 51 are bonded is higher than that in the case where the silicone film is formed on the upper surface 30A of the insulating layer 30. In this manner, bonding surfaces of the light emitting elements 51 (the lower surfaces of the light emitting elements 51 in this case) can be surely pressed against the silica film S1 formed in the outermost surface of the insulating layer 30 so that the bonding surfaces of the light emitting elements 51 can be bonded to the silica film S1. Accordingly, the light emitting elements 51 can be bonded to the upper surface 30A of the insulating layer 30 with higher bond strength than that in the case where the light emitting elements 51 are bonded to the upper surface 30A of the insulating layer 30 to which the surface treatment is not applied.

Successively, in the step shown in FIG. 6C, electrodes on one side (not shown) of the light emitting elements 51 are connected to the metal layers 40 through bonding wires 55 and electrodes on the other side (not shown) of adjacent ones of the light emitting elements 51 are connected to each other through bonding wires 55. In this manner, the light emitting elements 51 and the wiring patterns 20 are electrically connected to each other.

Next, the sealing resin 60 for sealing the plurality of light emitting elements 51 mounted on the wiring board 10 and the bonding wires 55 is formed. When, for example, a thermosetting resin is used as the sealing resin 60, the structure shown in FIG. 6C is received in a mold and the resin which has been fluidized is introduced into the mold while pressure (for example, in a range of about 5 to 10 MPa) is applied to the mold. Then, the resin is heated, for example, at about 180° C. to be hardened. In this manner, the sealing resin 60 is formed. Alternatively, the sealing resin 60 may be formed by potting a liquid resin. By the aforementioned manufacturing steps, a light emitting device 50 shown in FIG. 4 can be manufactured. Also, the sealing resin 60 may be provided on the upper surface of the wiring board 10 by injecting a resin material into a frame-shaped dam member (not shown) disposed on the upper surface of the insulating layer 30 at a peripheral portion thereof. The dam member may be made of metal and may serve as a reflection member.

According to the aforementioned embodiment, the following effects can be obtained.

(1) Surface treatment using reactive oxygen species is subjected to the upper surface 30A of the insulating layer 30 before the light emitting elements 51 are mounted. The silica film S1 can be formed on the upper surface 30A of the insulating layer 30 by the surface treatment. Further, the hydroxyl group can be generated in the outermost surface of the silica film S1. In this manner, the adhesive strength between the insulating layer 30 having the silica film S formed therein and the adhesive agent 52 can be improved so that the light emitting elements 51 can be bonded to the upper surface 30A of the insulating layer 30 with higher bond strength.

(2) The insulating layer 30 containing silicone excellent in heat resistance and light resistance is formed in the outermost layer of the wiring board 10. In this manner, the heat resistance can be improved as compared with that in the case where an insulating layer made of an epoxy based resin is formed in the outermost layer of the wiring board 10. Therefore, the insulating layer 30 containing silicone can be used as a reflecting layer in the outermost layer of the wiring board 10 even when the temperature of heat generated by each mounted component (each light emitting element 51 in this case) is increased.

(3) The silica film S1 is formed on the upper surface 30A of the insulating layer 30 by ultraviolet treatment or oxygen plasma treatment. Since the ultraviolet treatment and the oxygen plasma treatment do not require a combustion system etc. that used to be provided as in plasma treatment using $CF_4$ gas as the source, the silica film S1 can be formed inexpensively. Therefore, this can contribute to the reduction in manufacturing cost.

(4) The light emitting elements 51 are mounted on the insulating layer 31 having a high reflectance. Thus, light emission efficiency of each light emitting element 51 can be improved.

(5) The wiring pattern 21 is formed directly under the insulating layer 31 on which the light emitting elements 51 are mounted. Thus, heat generated from the light emitting elements 51 can be released from the insulating layer 31 through the wiring pattern 21 and the insulating layer 12 to the heat sink 11. Here, since the wiring pattern 21 has higher thermal conductivity than the insulating layer 31, heat generated from the light emitting elements 51 can be more efficiently released to the heat sink 11 than that in the case where the insulating layer 31 is formed on the insulating layer 12. Thus, the lowering of the light emission efficiency of the light emitting elements 51 can be suppressed preferably.

(6) The light emitting elements 51 are bonded on the insulating layer 30 by the adhesive agent 52 containing a silicone based resin and a silver filler. Thus, when the light emitting elements 51 are bonded to the insulating layer 30, the adhesive agent 52 reacts with the silica film Si formed on the upper surface 30A of the insulating layer 30 to thereby generate a Si—O—Si bond easily so that the adhesive strength between the insulating layer 30 and the adhesive agent 52 can be improved more greatly.

<Experimental Results>

Here, experimental results backing up the fact that the silica film S1 is formed on the insulating layer 30 by surface treatment using reactive oxygen species and the fact that the silica film S1 is formed to thereby improve the adhesive strength between the insulating layer 30 and the adhesive agent 52 as described above will be described in accordance with FIG. 7 and FIG. 8.

First, a wiring board 10 having substantially the same structure as the structure shown in FIG. 1 was manufactured by the same manufacturing method as in the first embodiment. In detail, an insulating layer 12 having a thickness of 0.1 mm was formed on an upper surface of a heat sink 11 made of aluminum with a thickness of 1 mm and a copper foil 20B having a thickness of 0.1 mm was formed on an upper surface of the insulating layer 12. Successively, after the copper foil 20B was patterned into a predetermined shape to thereby form wiring patterns 20 (wiring patterns 21 and 22), an insulating layer 30 having opening portions 30X and 30Y was formed and cured in an atmosphere at a temperature of 150° C. so as to be hardened. Next, an Ni layer 41 and an Au layer 42 were laminated sequentially on the wiring pattern 20 exposed from each of the opening portions 30X and 30Y by an electroless plating technique. On this occasion, the thickness of the Ni layer 41 was 5 μm, the thickness of the Au layer 42 was 0.5 μm, the thickness between the upper surface 12A of the insulating layer 12 and the upper surface 30A of the insulating layer 30 was 120 μm.

As to the wiring board 10 having the aforementioned structure, five kinds of evaluation samples (Samples 1 to 5) were produced and three kinds of comparison samples (Comparative Examples 1 to 3) were produced.

(Sample 1)

In Sample 1, a white insulating resin containing an epoxy based resin as the base and silica ($SiO_2$) and titanium oxide ($TiO_2$) as a filler was used as the material of the insulating layer 30. In addition, a photosensitive resin having photosensitivity containing an additive agent such as antifoam agent was used as the material of the insulating layer 30. Ultraviolet treatment was applied to the upper surface 30A of such an insulating layer 30. The ultraviolet treatment was performed in such a manner that oxygen concentration in a treatment chamber where the wiring board 10 as the target to be treated was placed was set at 5% and the upper surface of the wiring board 10 was irradiated with ultraviolet light (excimer UV light) at a wavelength of 172 nm. The radiation dose of the excimer UV light on this occasion was set at 6,000 $mJ/cm^2$.

(Sample 2)

In Sample 2, a white insulating resin containing an epoxy-based resin as the base and silica ($SiO_2$) and titanium oxide ($TiO_2$) as a filler was used as the material of the insulating layer 30. In addition, a non-photosensitive resin having no photosensitivity containing an additive agent such as antifoam agent was used as the material of the insulating layer 30. Ultraviolet treatment was applied to the upper surface 30A of such an insulating layer 30 under the same conditions as Sample 1.

(Sample 3)

In Sample 3, a white insulating resin containing a silicone-based resin as the base was used as the material of the insulating layer 30. In addition, ultraviolet treatment was applied to the upper surface 30A of such an insulating layer 30 under the same conditions as Sample 1.

(Sample 4)

In Sample 4, a white insulating resin containing a silicone-based resin as the base was used as the material of the insulating layer 30. Oxygen plasma treatment was applied to the upper surface 30A of such an insulating layer 30. The oxygen plasma treatment was performed under the following conditions. That is, the RF output was set at 250 W, the flow rate of oxygen was set at 15 sccm, the degree of vacuum was set at 20 Pa and the treatment time was set at about 30 seconds.

(Sample 5)

In Sample 5, a white insulating resin containing a silicone based resin as the base was used as the material of the insulating layer 30. Plasma treatment using gas containing oxygen and carbon tetrafluoride ($CF_4$) was applied to the upper surface 30A of such an insulating layer 30. The plasma treatment was performed under the following conditions. That is, the flow rate of oxygen was set at 10 sccm, the flow rate of carbon tetrafluoride was set at 5 sccm, the degree of vacuum was set at 20 Pa and the treatment time was set at 30 seconds.

Comparative Example 1

Comparative Example 1 is a sample compared with Sample 1. The sample of Comparative Example 1 is a sample manufactured under the same conditions as Sample 1 except that ultraviolet treatment was not applied to the upper surface 30A of the insulating layer 30.

Comparative Example 2

Comparative Example 2 is a sample compared with Sample 2. The sample of Comparative Example 2 is a sample manufactured under the same conditions as Sample 2 except that ultraviolet treatment was not applied to the upper surface 30A of the insulating layer 30.

Comparative Example 3

Comparative Example 3 is a sample compared with Samples 3 to 5. The sample of Comparative Example 3 is a sample manufactured under the same conditions as Samples 3 to 5 except that surface treatment (ultraviolet treatment or plasma treatment) was not applied to the upper surface 30A of the insulating layer 30.

(Evaluation Method)

Figure 7:
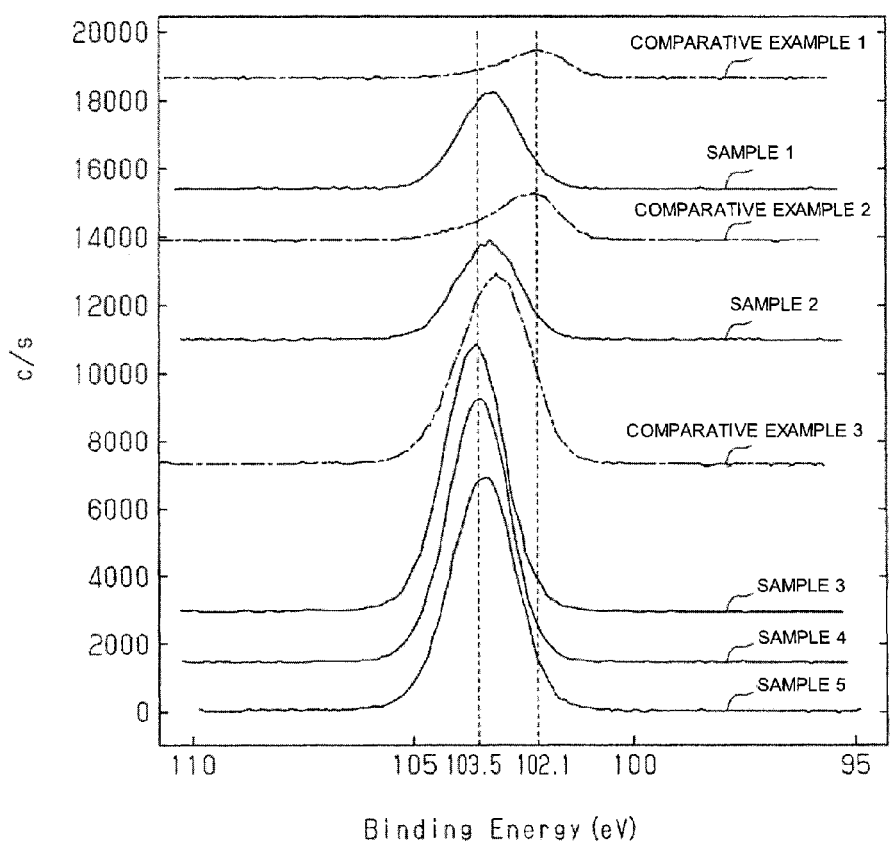
FIG. 7 is a graph showing analysis results using an ESCA apparatus.

The front surface state of the insulating layer 30 after surface treatment in each of Samples 1 to 5 was analyzed by an ESCA (Electron Spectroscopy for Chemical Analysis) apparatus and the front surface state of the insulating layer 30 in each of Comparative Examples 1 to 3 (the front surface state of the insulating layer 30 before the surface treatment) was analyzed by the ESCA apparatus. Results of narrowband spectrum measurements based on the ESCA are shown in FIG. 7. Analysis based on the ESCA was performed under the following conditions. That is, Quantera SXM made by ULVAC-PHI, INCORPORATED was used as an apparatus, AlKα (monochromator) was used as an X-ray source, the extraction angle of photoelectrons was set at 45 degrees, the measurement region was set at a region with a diameter of about 100 μm and a charge neutralization mechanism was used.

Figure 8:
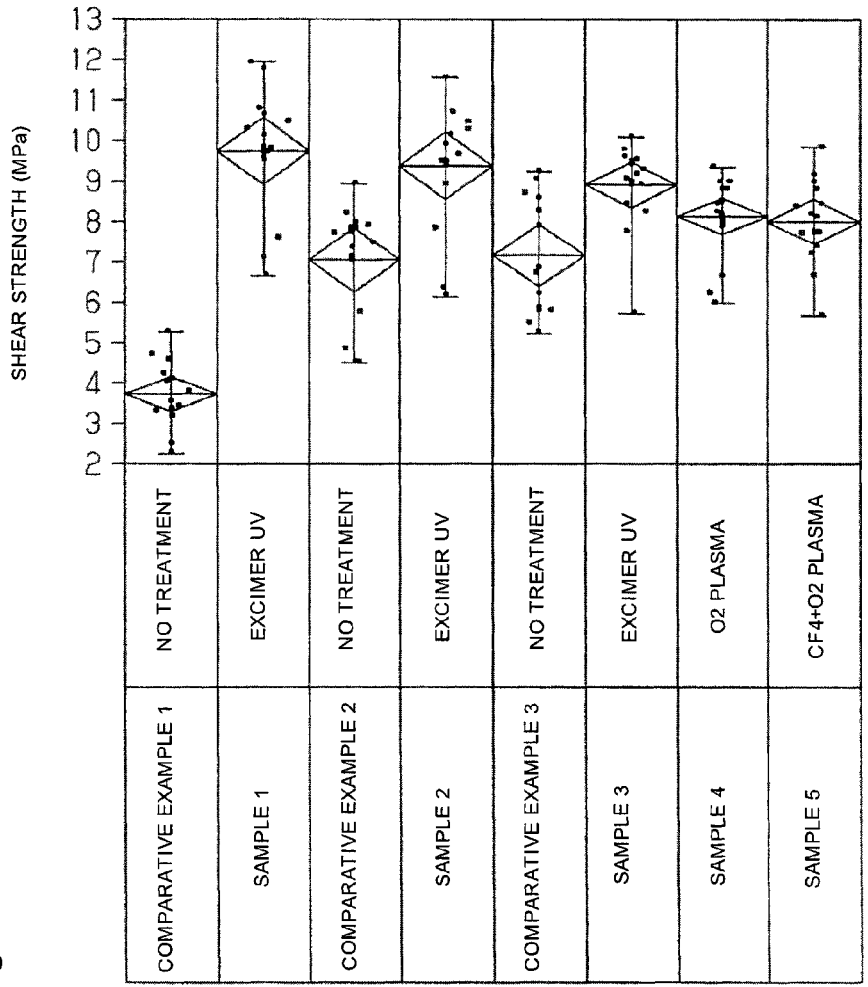
FIG. 8 is a graph showing measurement results of shear strength.

Successively, light emitting elements 51 were bonded to the upper surface 30A of the insulating layer 30 according to each of Samples 1 to 5 and the samples of Comparative Examples 1 to 3 by the adhesive agent 52. Shear strength between the insulating layer 30 and the adhesive agent 52 was measured. Results of the measurement are shown in FIG. 8.

(Evaluation Results)

It can be conceived that the peak near the binding energy of 103.5 eV was derived from the compound $SiO_2$ (silica), and the peak near the binding energy of 102.1 eV was derived from the compound SiO (silicone) in FIG. 7. As apparent from the results of FIG. 7, no peak was detected near 103.5 eV corresponding to silica ($SiO_2$) but a peak was detected near 102.1 eV corresponding to silicone (SiO) in the spectrum of Comparative Example 1 or 2 in which surface treatment was not applied to the upper surface 30A of the insulating layer 30. It can be conceived that this is because the silicone film was formed to have a large amount in comparison with the silica film on the upper surface 30A of the insulating layer 30 in Comparative Example 1 or 2. Incidentally, in the spectrum of Comparative Example 3, a peak was detected between 103.5 eV corresponding to silica and 102.1 eV corresponding to silicone. It can be conceived that this is because both the silicone film and the silica film were formed on the upper surface 30A of the insulating layer 30 in Comparative Example 3.

On the other hand, in the spectrum of each of Samples 1 to 5 in which surface treatment was applied to the upper surface 30A of the insulating layer 30, no peak was detected near 102.1 eV corresponding to silicone but a peak was detected near 103.5 eV corresponding to silica. It is presumed that this result is derived from the fact that a large amount of the silica film was formed on the upper surface 30A of the insulating layer 30 in comparison with the amount of the silicone film because surface treatment using reactive oxygen species was applied to the upper surface 30A of the insulating layer 30. It can be conceived that this is because surface treatment using reactive oxygen species was applied to the upper surface 30A of the insulating layer 30 as described above, for example, in Samples 3 to 5, so that the reactive oxygen species and the silicone film formed on the insulating layer 30 reacted with each other to thereby form the $SiO_2$ film. In addition, it can be conceived that this is because surface treatment using reactive oxygen species was applied to the upper surface 30A of the insulating layer 30 in Samples 1 and 2 so that silicone contained in antifoam agent of the insulating layer 30 reacted with the reactive oxygen species to thereby form the $SiO_2$ film.

As apparent from comparison between Sample 1 and Comparative Example 1, between Sample 2 and Comparative Example 2, and between Samples 3 to 5 and Comparative Example 3 in FIG. 8, shear strength can be improved more greatly when surface treatment using reactive oxygen species is applied to the insulating layer 30 (Samples 1 to 5) before the light emitting elements 51 are mounted than when the surface treatment is not applied to the insulating layer 30 (Comparative Examples 1 to 3). It can be conceived that such an improvement in shear strength is derived from the silica ($SiO_2$) film formed on the upper surface 30A of the insulating layer 30.

Based on the above description, when surface treatment using reactive oxygen species is applied to the upper surface 30A of the insulating layer 30, the silica film S1 can be formed on the upper surface 30A of the insulating layer 30 and further shear strength between the insulating layer 30 and the adhesive agent 52 can be improved. That is, when surface treatment using reactive oxygen species is applied to the upper surface 30A of the insulating layer 30, adhesive strength between the insulating layer 30 and the adhesive agent 52 can be improved more greatly and shear strength between the insulating layer 30 and the adhesive agent 52 can be improved more greatly than when the surface treatment is not applied to the upper surface 30A of the insulating layer 30.

(Modification of First Embodiment)

In the aforementioned embodiment, surface treatment using reactive oxygen species is applied to the upper surface 30A of the insulating layer 30 after the metal layers 40 are formed, but the present invention is not limited to this sequence.

Figure 9A:
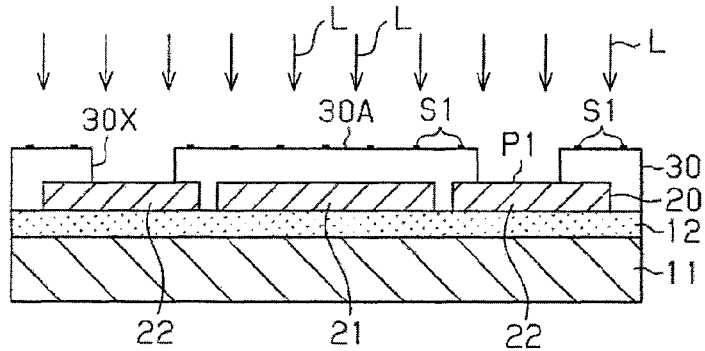
FIGS. 9A and 9B are schematic sectional views showing a method for manufacturing a wiring board according to a modification.
Figure 9B:
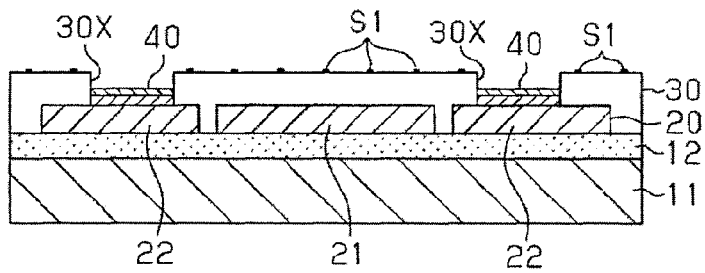

For example, surface treatment using reactive oxygen species may be applied to the upper surface 30A of the insulating layer 30 after the insulating layer 30 is cured in an atmosphere at a temperature of about 150° C. to be hardened, as shown in FIG. 9A. Alternatively, the metal layers 40 may be formed on the wiring patterns 20 exposed from the insulating layer 30, for example, by an electroless plating technique after the aforementioned surface treatment, as shown in FIG. 9B.

Second Embodiment

A second embodiment will be described below with reference to FIG. 10, FIGS. 11A to 11D and FIGS. 12A to 12D. Structures of an insulating layer 30 and metal layers in the embodiment are different from those in the first embodiment. Different points from the first embodiment will be described mainly.

Figure 10:
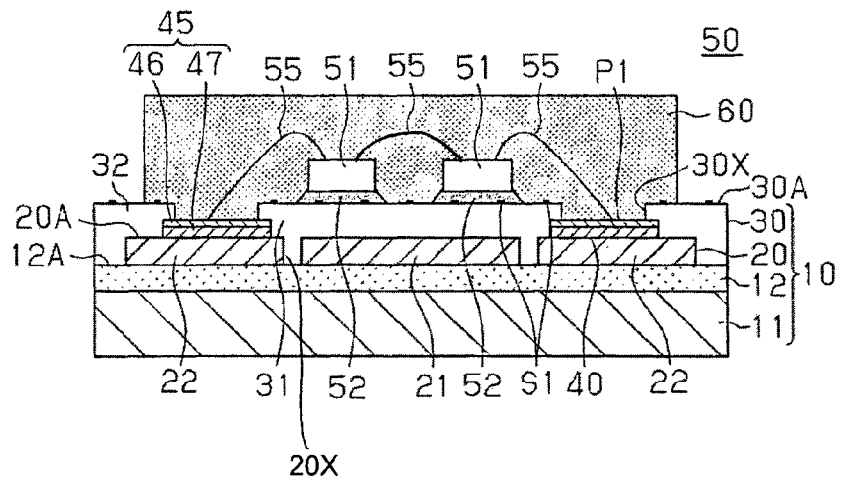
FIG. 10 is a schematic sectional view showing a light emitting device according to a second embodiment.

As shown in FIG. 10, a plurality of metal layers 45 are formed on wiring patterns 20 (wiring patterns 22). Each of the metal layers 45 is substantially formed, for example, into a circular shape in plan view in the same manner as the metal layer 40. Examples of the metal layer 45 may include a metal layer in which an Ni layer and an Au layer are laminated sequentially in this order on an upper surface 20A of the wiring pattern 20, a metal layer in which an Ni layer, a Pd layer and an Au layer are laminated sequentially likewise, a metal layer in which an Ni layer, a Pd layer and an Ag layer are laminated sequentially likewise, and a metal layer in which an Ni layer, a Pd layer, an Ag layer, and an Au layer are laminated sequentially likewise. For example, a metal layer (an electrolytic plating metal layer) formed by an electrolytic plating technique may be used as each of the Ni layer, the Au layer, the Pd layer and the Ag layer. In the embodiment, an Ni layer 46 and an Au layer 47 are laminated in this order to thereby form the metal layer 45 on the upper surface 20A of the wiring pattern 20. The thickness of the Ni layer 46 may be set to be, for example, about 0.1 to 3 µm. The thickness of the Au layer 47 may be set to be, for example, about 0.01 to 1 µm.

The insulating layer 30 is formed to partially cover the upper surfaces 20A of the wiring patterns 20, an upper surface 12A of an insulating layer 12 and upper surfaces of the metal layers 45. A plurality of opening portions 30X for exposing parts of the metal layers 45 as wiring bonding pads P1 are formed in the insulating layer 30. In addition, although not shown, a pair of opening portions 30Y for exposing parts of the metal layers 45 as electrode terminals are formed in the insulating layer 30 in the same manner as in the first embodiment. The insulating layer 30 has an insulating layer 31 and an insulating layer 32. The insulating layer 31 covers the whole of a front surface (upper surface and side surface) of a wiring pattern 21 and covers parts of the insulating layer 12, the wiring patterns 22 and the metal layers 45 surrounding the wiring pattern 21. The insulating layer 32 covers the whole of the upper surface 12A of the insulating layer 12 and parts of the wiring patterns 22 and the metal layers 45, which are exposed from the insulating layer 31.

In addition, a silica film S1 is formed on parts of the upper surface 30A of the insulating layer 30. For example, the content of silica ($SiO_2$) is higher than the content of silicone (Si—O) on the upper surface 30A of the insulating layer 30.

Next, a method for manufacturing the light emitting device 50 will be described now. One wiring board 10 and one light emitting device 50 will be enlarged and explained in the following description. In practice, however, a member which will be a plurality of wiring boards 10 is manufactured collectively on one substrate and then divided into individual wiring boards 10 or a member which will be a plurality of light emitting devices 50 is manufactured collectively on one substrate and then divided into individual light emitting devices 50.

Figure 11A:
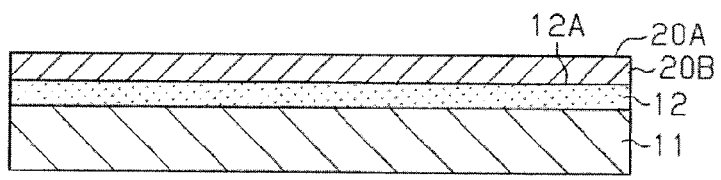
FIGS. 11A to 11D are schematic sectional views showing a method for manufacturing the light emitting device according to the second embodiment.

First, in a step shown in FIG. 11A, an insulating layer 12 is formed to cover the whole of an upper surface of a heat sink 11 and a copper foil 20B is formed to cover the whole of an upper surface 12A of the insulating layer 12, in the same manner as the step shown in FIG. 5A.

Figure 11B:
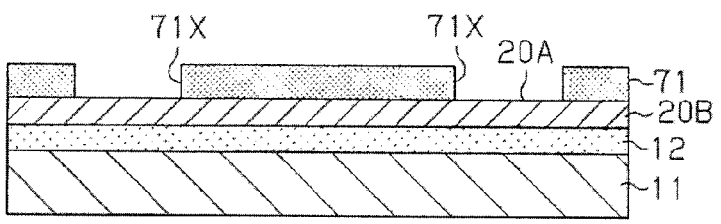

Next, in a step shown in FIG. 11B, a resist layer 71 having opening patterns 71X in predetermined places is formed on an upper surface 20A of the copper foil 20B. The opening patterns 71X are formed to expose the copper foil 20B in portions corresponding to the metal layers 45 (see FIG. 10). A material having plating resistance may be used as the material of the resist layer 71. Specifically, a photosensitive dry film resist or a liquid photoresist (for example, a dry film resist or a liquid resist made of a novolac based resin, an acrylic based resin, etc.) or the like may be used as the material of the resist layer 71. The resist layer 71 can be formed by the same method as the resist layer 70.

Figure 11C:
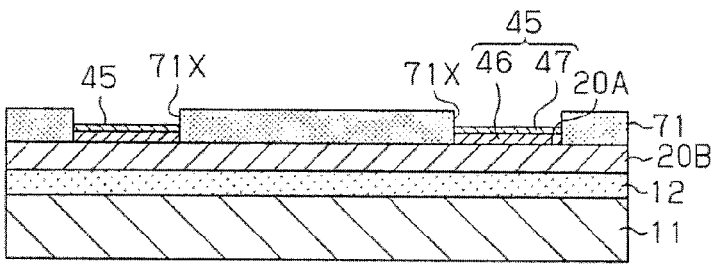

Successively, in a step shown in FIG. 11C, an electrolytic plating technique which uses the copper foil 20B as a plating power supply layer is applied to the upper surface 20A of the copper foil 20B with the resist layer 71 as a plating mask. Specifically, when electrolytic plating is applied to the upper surface 20A of the copper foil 20B exposed from the opening patterns 71X of the resist layer 71, metal layers 45 are formed on the copper foil 20B. Here, when each of the metal layers 45 has the structure in which an Ni layer 46 and an Au layer 47 are laminated, the Ni layer 46 and the Au layer 47 are laminated sequentially on the upper surface 20A of the copper foil 20B exposed from the opening patterns 71X of the resist layer 71 by the electrolytic plating technique.

Figure 11D:
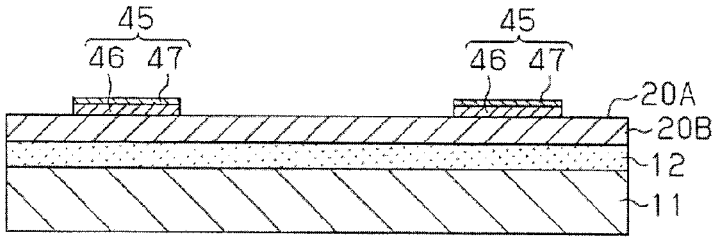

Then, in a step shown in FIG. 11D, the resist layer 71 shown in FIG. 11C is removed, for example, by an alkaline strip liquid.

Figure 12A:
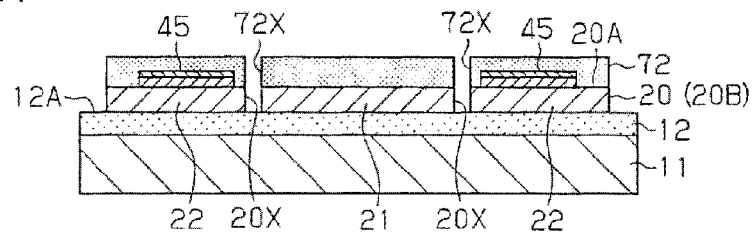
FIGS. 12A to 12D are schematic sectional views showing the method for manufacturing the light emitting device according to the second embodiment.

Next, in a step shown in FIG. 12A, a resist layer 72 having opening portions 72X in predetermined places is formed on the upper surface 20A of the copper foil 20B. The resist layer 72 is formed to cover the copper foil 20B corresponding to required wiring patterns 20. In other words, the resist layer 72 has the opening portions 72X formed in positions corresponding to opening portions 20X. A material having etching resistance may be used as the material of the resist layer 72. For example, the same material as that of the resist layer 70 may be used as the material of the resist layer 72. In addition, the resist layer 72 can be formed by the same method as the resist layer 70.

Successively, the copper foil 20B is etched with the resist layer 72 as an etching mask so that the copper foil 20B is patterned into a predetermined shape. Thus, the opening portions 20X are formed in the copper foil 20B so that the required wiring patterns 20 are formed on the upper surface 12A of the insulating layer 12. Then, the resist layer 72 is removed, for example, by an alkaline strip liquid.

Figure 12B:
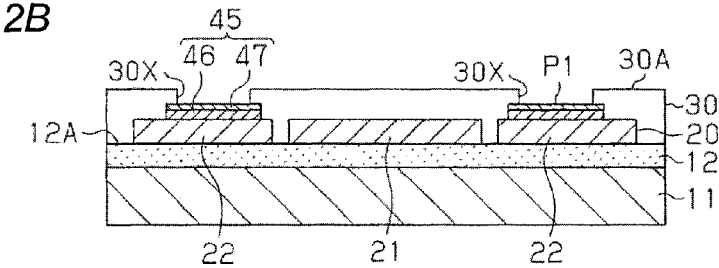

Then, in a step shown in FIG. 12B, an insulating layer 30 having opening portions 30X or 30Y for exposing parts of the upper surfaces of the metal layers 45 as pads P1 or electrode terminals P2 (the electrode terminals P2 and the opening portions 30Y are not shown in FIG. 12B) is formed on the insulating layer 12 and the wiring patterns 20. This insulating layer 30 may be formed, for example, by a method of screen-printing a resin paste. Successively, the insulating layer 30 is cured in an atmosphere at a temperature of about 150° C. so as to be hardened.

Figure 12C:
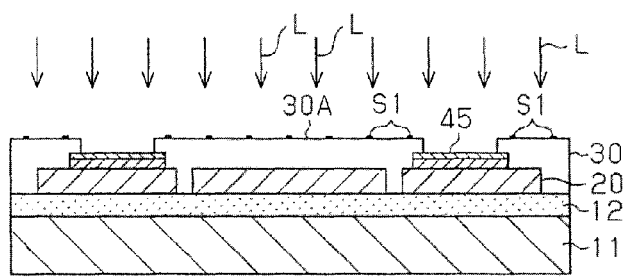

Next, surface treatment using reactive oxygen species is applied to the structure shown in FIG. 12B in a step shown in FIG. 12C. For example, ultraviolet treatment or oxygen plasma treatment may be used as the surface treatment. In the example of FIG. 12C, the upper surface of the structure shown in FIG. 12B (at least the upper surface 30A of the insulating layer 30) is irradiated with ultraviolet light L in the same manner as in the previous step shown in FIG. 6B. A silica film S1 can be formed on the upper surface 30A of the insulating layer 30 by such surface treatment so that a hydroxyl group can be formed in an outermost surface of the silica film Si.

By the aforementioned manufacturing steps, a wiring board 10 shown in FIG. 10 can be manufactured.

Figure 12D:
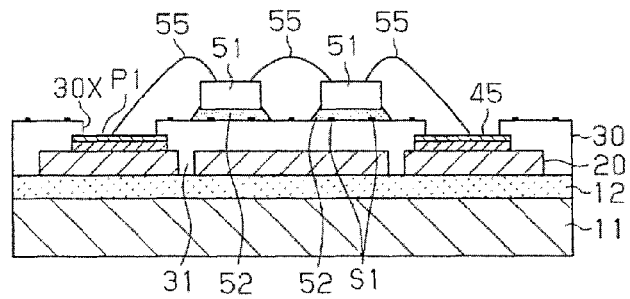

Next, in a step shown in FIG. 12D, a plurality of light emitting elements 51 are bonded to the upper surface 30A of the insulating layer 30 (insulating layer 31) of the wiring board 10 by an adhesive agent 52. On this occasion, the light emitting elements 51 are mounted on the insulating layer 31 while light emitting surfaces of the light emitting elements 51 where electrode terminals (not shown) are formed face up.

In this step, the silica film S1 is formed on the upper surface 30A of the insulating layer 30 and the hydroxyl group is generated in the outermost surface of the silica film S1 when the light emitting elements 51 are bonded onto the insulating layer 30 by the adhesive agent 52. In this manner, adhesive strength between the insulating layer 30 and the adhesive agent 52 can be improved.

Successively, in the step shown in FIG. 12D, electrodes on one side (not shown) of the light emitting elements 51 are connected to the metal layers 45 through bonding wires 55 and electrodes on the other side (not shown) of adjacent ones of the light emitting elements 51 are connected to each other through bonding wires 55. In this manner, the light emitting elements 51 and the wire patterns 20 are electrically connected to each other.

Next, a sealing resin 60 for sealing the plurality of light emitting elements 51 mounted on the wiring board 10 and the bonding wires 55 is formed. By the aforementioned manufacturing steps, a light emitting device 50 shown in FIG. 10 can be manufactured. Also, the sealing resin 60 may be provided on the upper surface of the wiring board 10 by injecting a resin material into a frame-shaped dam member (not shown) disposed on the upper surface of the insulating layer 30 at a peripheral portion thereof. The dam member may be made of metal and may serve as a reflection member.

According to the aforementioned embodiment, it is possible to obtain the following effect in addition to the effects (1) to (6) of the first embodiment.

(7) The insulating layer 30 having the opening portions 30X and 30Y exposing parts of the metal layers 45 is formed after the metal layers 45 are formed on the upper surfaces 20A of the wiring patterns 20 by the electrolytic plating technique. In this case, the insulating layer 30 has not been formed yet before the metal layers 45 are formed by the electrolytic plating technique. Accordingly, a plating liquid can be prevented from being degraded due to the presence of the insulating layer 30. Thus, the life of the plating liquid can be extended so that the plating liquid can be used continuously. As a result, it can contribute to the reduction of cost.

Further, the insulating layer 30 can be prevented from being soaked into the plating liquid in a plating tank when electroless plating or electrolytic plating is performed. Accordingly, the plating liquid can be prevented from infiltrating the insulating layer 30. Thus, the reflectance of the insulating layer 30 can be suppressed from being lowered.

Other Embodiments

Incidentally, the aforementioned embodiments may be carried out in the following modes in which the embodiments have been changed suitably.

The upper surfaces 20A of the wiring patterns 20 in the embodiments may be roughened. In this case, the upper surfaces 20A of the wiring patterns 20 are formed with fine irregularities. The roughness of the roughened upper surfaces 20A of the wiring patterns 20 may be set to be, for example, 55 to 200 nm in terms of surface roughness Ra value. Here, the surface roughness Ra value is one kind of numeral value expressing the surface roughness and referred to as arithmetic average roughness. Specifically, absolute values of heights changing in a measurement region are measured from a surface on an average line and arithmetically averaged. The surface roughness Ra value is measured, for example, using an atomic force microscope.

In this case, roughening treatment is applied to the copper foil 20B after the insulating layer 12 and the copper foil 20B are laminated sequentially on the heat sink 11, for example, in the step shown in FIG. 5A or FIG. 11A. By the roughening treatment, fine irregularities are formed in the upper surface 20A of the copper foil 20B so that the upper surface 20A is roughened. The roughening treatment may be performed, for example, by blackening treatment, etching treatment, plating, blasting, etc.

The insulating layer 31 and the insulating layer 32 in the aforementioned embodiments may be set to have different thicknesses. For example, the insulating layer 31 formed in the light emitting element mounting region in which the light emitting elements 51 are mounted may be formed to be thicker than the insulating layer 32. For example, the insulating layer 31 and the insulating layer 32 having such different thicknesses can be formed in the following manner. That is, after the insulating layer 31 and the insulating layer 32 having the same thickness as that of the insulating layer 31 are formed on the wiring patterns 20 and the insulating layer 12, the insulating layer 32 is thinned by a blasting method etc. so that the insulating layer 32 thinner than the insulating layer 31 can be formed. Alternatively, the insulating layer 31 and the insulating layer 32 may be formed in different steps so that the insulating layers 31 and 32 having different thicknesses can be formed. For example, after the insulating layer 32 is formed in the state in which formation regions of the insulating layer 31, the pads P1 and the electrode terminals P2 are masked, the insulating layer 31 may be formed in the state in which the formation region of the insulating layer 32 and the formation regions of the pads P1 and the electrode terminals P2 are masked. On this occasion, the order in which the insulating layers 31 and 32 are formed is not particularly limited in this embodiment.

Recesses may be formed in the upper surface 30A of the insulating layer 31 in the aforementioned embodiments so that the light emitting elements 51 can be mounted on the bottoms of the recesses. In this case, surface treatment using reactive oxygen species is applied to the upper surface of the insulating layer 31 including the recesses after the recesses are formed in the upper surface of the insulating layer 31.

The wiring pattern 21 in the aforementioned embodiments may be omitted.

The wiring patterns 20 are formed on the upper surface 12A of the insulating layer 12 in the aforementioned embodiments, but the present invention is not limited thereto. For example, recesses may be formed in the upper surface 12A of the insulating layer 12 so that the wiring patterns 20 can be formed on the bottoms (first surfaces) of the recesses.

The metal layers 40 or 45 are formed on the upper surfaces 20A of the wiring patterns 20 in the aforementioned embodiments, but the present invention is not limited thereto. For example, recesses may be formed in the upper surfaces 20A of the wiring patterns 20 so that the metal layers 40 or 45 can be formed on the bottoms (first surfaces) of the recesses.

The planar shape of each of the wiring patterns 20 in the aforementioned embodiments is not limited to a rectangular shape but may be a triangular shape or a polygonal shape having five or more sides or may be a circular shape.

The planar shape of each of the opening portions 30X and 30Y of the insulating layer 30 and the planar shape of each of the metal layers 40 or 45 in the aforementioned embodiments are not limited to a circular shape but may be a polygonal shape such as a rectangular shape or a pentagonal shape or may be a semicircular shape or an elliptic shape.

The planar shape of the wiring board 10 and the planar shape of the light emitting device 50 in the aforementioned embodiments are not limited to a rectangular shape. For example, the planar shape of the wiring board 10 and the planar shape of the light emitting device 50 may be a triangular shape or a polygonal shape having five or more sides or may be a circular shape. The wiring board 10 may be formed with through holes. Also, the wiring board 10 may be formed with notches at the outer periphery thereof. These through holes or notches may be used as a fixing member for fixing the wiring board 10 onto a mounting board (not shown) in fixing the wiring board onto the mounting board using screws.

For example, a light emitting element submount may be mounted on the wiring board 10 according to the aforementioned embodiments by wire bonding in place of the light emitting element 51. For example, the light emitting element submount has a structure in which a light emitting element is mounted on a submount substrate made of ceramics etc., a reflecting plate is disposed to surround the light emitting element and the light emitting element is sealed by a sealing resin.

Various aspects of the subject matter described herein are set out non-exhaustively in the following numbered clauses:

1. A method of manufacturing a wiring board for mounting a light emitting element thereon, wherein the wiring board comprises an insulating layer and a wiring pattern on the insulating layer, the method comprising:

(a) forming a reflecting layer on the insulating layer to cover the wiring pattern; and (b) providing reactive oxygen species on a surface of the reflecting layer.

2. The method of clause 1, wherein the reactive oxygen species are generated by irradiating an oxygen gas with ultraviolet light or generated by an oxygen gas plasma.

3. A method of manufacturing a light emitting device comprising: a wiring board including an insulating layer and a wiring pattern on the insulating layer; and a light emitting element mounted on the wiring board, the method comprising:

(a) forming a reflecting layer on the insulating layer to cover the wiring pattern;

(b) providing reactive oxygen species on a surface of the reflecting layer; and (c) bonding the light emitting element onto the surface of the reflecting layer via an adhesive agent after step (b).

As described above, the preferred embodiment and the modifications are described in detail. However, the present invention is not limited to the above-described embodiment and the modifications, and various modifications and replacements are applied to the above-described embodiment and the modifications without departing from the scope of claims.

What is claimed is:

1. A wiring board for mounting a light emitting element thereon, the wiring board comprising:

an insulating layer;

a wiring pattern on the insulating layer;

a reflecting layer on the insulating layer to cover the wiring pattern, wherein the light emitting element is to be mounted on a surface of the reflecting layer; and a silica film on the surface of the reflecting layer.

2. The wiring board of claim 1, wherein: the reflecting layer is made of an insulating resin containing Si.

3. The wiring board of claim 1,
wherein the reflecting layer has an opening,
wherein the wiring pattern comprises:
a first wiring pattern exposed through the opening of the reflecting layer, wherein an exposed portion of the first wiring pattern serves as a pad; and
a second wiring pattern separated from the first wiring pattern, and
wherein the light emitting element is to be mounted on the surface of the reflecting layer such that a position of the light emitting element is overlapped with a position of the second wiring pattern in a thickness direction of the wiring board.

4. The wiring board of claim 1,
wherein the insulating layer comprises a first surface and a second surface opposite to the first surface,
wherein the wiring pattern and the reflecting layer are formed on the first surface of the insulating layer, and
wherein the wiring board further comprises: a heat sink on the second surface of the insulating layer.

5. The wiring board of claim 1, wherein: the reflecting layer is made of an insulating resin containing a silicone-based resin.

6. The wiring board of claim 1, wherein a reflectance of the reflecting layer is 50% or more in a wavelength range of from 450 nm to 700 nm.

7. A light emitting device comprising:
the wiring board of claim 1; and
a light emitting element mounted on the surface of the reflecting layer of the wiring board via an adhesive agent.

8. The light emitting device of claim 7, wherein the adhesive agent is made of a silicone-based resin.

* * * * *